United States Patent
Cho et al.

(10) Patent No.: US 8,389,329 B2
(45) Date of Patent: Mar. 5, 2013

(54) INTEGRATED CIRCUIT PACKAGING SYSTEM WITH PACKAGE STACKING AND METHOD OF MANUFACTURE THEREOF

(75) Inventors: NamJu Cho, Uiwang-si (KR); HeeJo Chi, Ichon-si (KR); HanGil Shin, Seongnam-si (KR)

(73) Assignee: STATS ChipPac Ltd., Singapore (SG)

( * ) Notice: Subject to any disclaimer, the term of this patent is extended or adjusted under 35 U.S.C. 154(b) by 0 days.

(21) Appl. No.: 13/118,955

(22) Filed: May 31, 2011

(65) Prior Publication Data
US 2012/0306102 A1    Dec. 6, 2012

(51) Int. Cl.
*H01L 21/50* (2006.01)
*H01L 21/48* (2006.01)
*H01L 21/44* (2006.01)
*H01L 23/02* (2006.01)
*H01L 23/52* (2006.01)
*H01L 23/485* (2006.01)

(52) U.S. Cl. ........ 438/107; 438/109; 438/108; 257/686; 257/780; 257/E23.021

(58) Field of Classification Search .................. 438/107, 438/109, 108; 257/686, 780, E23.021
See application file for complete search history.

(56) References Cited

U.S. PATENT DOCUMENTS

| | | | |
|---|---|---|---|
| 7,919,871 B2 * | 4/2011 | Moon et al. | 257/777 |
| 8,115,293 B2 * | 2/2012 | Moon et al. | 257/686 |
| 2007/0045796 A1 * | 3/2007 | Ye et al. | 257/678 |
| 2007/0290376 A1 | 12/2007 | Zhao et al. | |
| 2008/0211084 A1 * | 9/2008 | Chow et al. | 257/700 |
| 2009/0166835 A1 * | 7/2009 | Yang et al. | 257/686 |
| 2009/0236720 A1 * | 9/2009 | Yoon et al. | 257/686 |
| 2009/0236731 A1 | 9/2009 | Shim et al. | |
| 2010/0244212 A1 * | 9/2010 | Ha et al. | 257/676 |
| 2011/0024887 A1 * | 2/2011 | Chi et al. | 257/684 |

* cited by examiner

*Primary Examiner* — Luan C Thai
(74) *Attorney, Agent, or Firm* — Ishimaru & Associates LLP; Mikio Ishimaru

(57) ABSTRACT

A method of manufacture of an integrated circuit packaging system includes: providing a base package carrier; mounting an interposer over the base package carrier; forming a base package encapsulation over the base package carrier and the interposer with the base package encapsulation having a cavity for exposing the interposer; and forming a support recess in the base package encapsulation between a non-horizontal edge of the base package encapsulation and the cavity.

20 Claims, 4 Drawing Sheets

INTEGRATED CIRCUIT PACKAGING SYSTEM WITH PACKAGE STACKING AND METHOD OF MANUFACTURE THEREOF

TECHNICAL FIELD

The present invention relates generally to an integrated circuit packaging system, and more particularly to a stackable packaging system.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made using the semiconductor package structures. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package-on-package (POP). POP designs face reliability challenges and higher cost.

Thus, a need still remains for an integrated circuit system improved yield, low profile, and improved reliability. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a base package carrier; mounting an interposer over the base package carrier; forming a base package encapsulation over the base package carrier and the interposer with the base package encapsulation having a cavity for exposing the interposer; and forming a support recess in the base package encapsulation between a non-horizontal edge of the base package encapsulation and the cavity.

The present invention provides an integrated circuit packaging system, including: a base package carrier; an interposer over the base package carrier; a base package encapsulation over the base package carrier and the interposer with the base package encapsulation having a cavity for exposing the interposer and a support recess formed between a non-horizontal edge of the base package encapsulation and the cavity.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
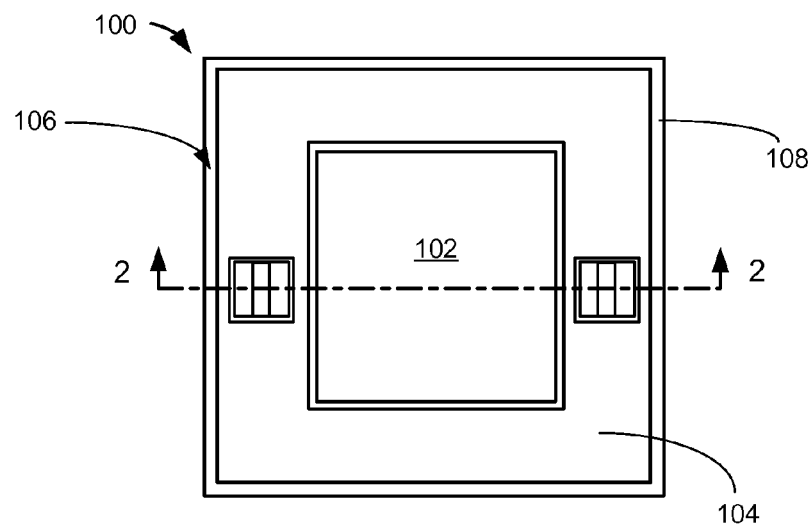
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

In addition, where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The top view depicts a stackable package 106 that can include a stackable integrated circuit 102 mounted on a stackable package carrier 104. The stackable package 106 is defined as a packaged integrated circuit that can be mounted on other package or structures, or receive other packages. The stackable package 106 can be mounted on top of a base package encapsulation 108. The stackable integrated circuit 102 is defined as a chip with active circuitry fabricated thereon. For example, the stackable integrated circuit 102 can include a flip chip, a wire bonded chip, or a packaged integrated circuit.

The stackable package carrier 104 is defined as a mounting device for an integrated circuit or other electrical components as well as providing electrical connections between, to, and from the devices mounted thereto. The stackable integrated circuit 102 can be mounted to and over the stackable package carrier 104. For example, the stackable package carrier 104 can include a laminated substrate, a ceramic substrate, or an electrical redistribution structure. The top view also depicts the stackable package carrier 104 mounted over the base package encapsulation 108. The base package encapsulation 108 is defined as a film assist molding, injection molding, or other encasement structure that encapsulates the packaged integrated circuit.

Figure 2:
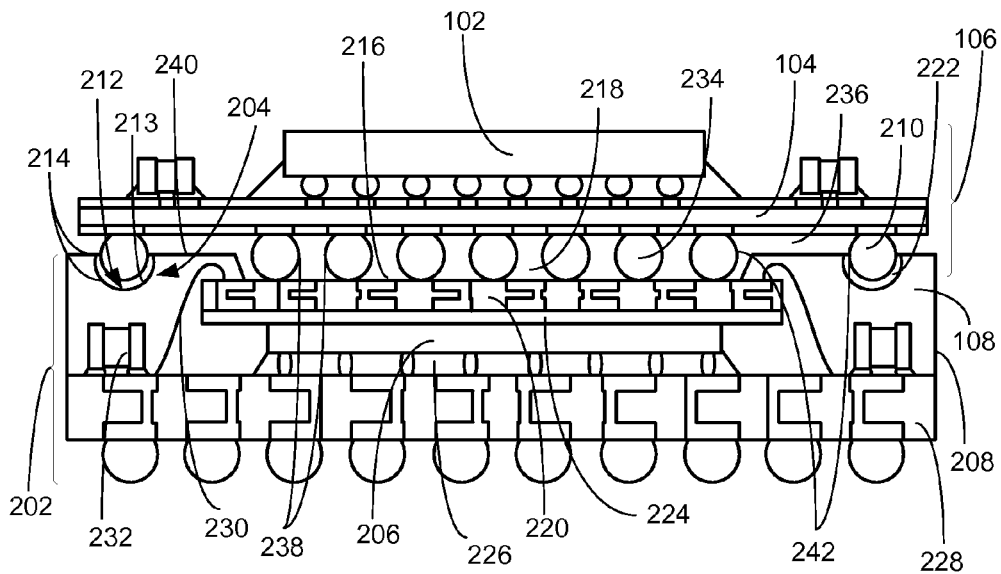
FIG. 2 is a cross-sectional view of the integrated circuit packaging system along line 2-2 of FIG. 1.

Referring now to FIG. 2, therein is shown a cross-sectional view of the integrated circuit packaging system 100 along line 2-2 of FIG. 1. The cross-sectional view depicts the stackable package 106 mounted on top of a base package 202. The base package 202 is defined as a packaged integrated circuit.

The base package 202 can include a base package carrier 228. The base package carrier 228 is defined as a mounting device for an integrated circuit or other electrical components as well as providing electrical connections between, to, and from the devices mounted thereto. For example, a base integrated circuit 206 can be mounted to and over the base package carrier 228. For another example, the base package carrier 228 can represent a substrate.

The base integrated circuit 206 is defined as a chip with active circuitry packaged in the base package 202. For example, the base integrated circuit 206 can include a flip chip, a wire bonded chip, or a packaged integrated circuit.

The base package 202 can include an inner underfill 226. The inner underfill 226 is defined as a structure that provides adhesion and rigidity for mounting an integrated circuit or electrical component on other integrated circuit or electrical component. For example, the inner underfill 226 can be applied to adhere the base integrated circuit 206 to the base package carrier 228. For another example, the inner underfill 226 can include an epoxy mixture that provides rigidity and adhesion.

The base package 202 can include a discrete component 232. The discrete component 232 is defined as an electronic component with one circuit element. For example, the discrete component 232 can be mounted on the base package carrier 228.

The base package 202 can include an inner adhesive 224. The inner adhesive 224 is defined as a sticky material for holding components in place. For example, the inner adhesive 224 can be applied to adhere the base integrated circuit 206 to an interposer 220. For another example, the inner adhesive 224 can include a resin, glue, paste, cement, putty, or a polyvinyl resin emulsion.

The base package 202 can include the interposer 220 having an interposer top 216. The interposer 220 is defined as an electrical interface routing structure. The interposer top 216 is defined as the top side of the interposer 220.

The base package 202 can include an electrical interconnect 230. The electrical interconnect 230 is defined as a connection interface for electrical connection to other components. For example, the electrical interconnect 230 can include a bondwire, solder columns, solder balls, conductive interconnects, or lateral interconnects. The electrical interconnect 230 can represent a bondwire to electronically connect the base package carrier 228 and the interposer 220. For example, the electrical interconnect 230 can be made out of a material representing aluminum, copper, gold, or alloy thereof. Furthermore, the electrical interconnect 230 can include aluminum, copper, or gold wire.

The base package encapsulation 108 can encapsulate the base package 202. For example, the base package encapsulation 108 can be formed over the base package carrier 228 and the interposer 220 with the base package encapsulation 108 having a cavity 218 for exposing the interposer 220. The cavity 218 is defined as an indentation of a surface with sloped edges terminating at the interposer 220.

The interposer 220 can represent the second surface of the cavity 218. For example, the base package encapsulation 108 can be formed with the interposer top 216 of the interposer 220 exposed.

The base package encapsulation 108 can include a support recess 204. The support recess 204 is defined as an indentation from a top surface of the base package encapsulation 108. For example, the support recess 204 can be formed by various known methods, such as from protruded mode chase, mechanical or laser drilling, chemical etching with mask, or a combination thereof.

For a specific example, the shape of the support recess 204 can include variety of geometrics, such as of a circular geometry, an oval geometry, including linear or arc shaped segments, or a combination thereof. In this example, the support recess 204 can be formed as a dimple with a shape of a half sphere.

For example, the support recess 204 can be formed from an encapsulation top 240 into the base package encapsulation 108 between a non-horizontal edge 208 of the base package encapsulation 108 and the cavity 218. The encapsulation top 240 can represent the surface or the top side of the base package encapsulation 108. The non-horizontal edge 208 is defined as the borderline of the packaged integrated circuit where the packaged integrated circuit had been separated from a larger structure by a process of sawing, shearing, laser trimming, or the like.

For another example, the support recess 204 can be formed in the base package encapsulation 108 between the non-horizontal edge 208 of the base package encapsulation 108 and the cavity 218. For a different example, the support recess 204 can be formed adjacent to the non-horizontal edge 208 of the base package encapsulation 108 with each of the support recess 204 spatially separated. For another example, the support recess 204 can be formed above the discrete component 232. For a different example, the support recess 204 can be formed evenly distributed on the base package encapsulation 108.

The support recess 204 can include a recess bottom 212. The recess bottom 212 is defined as the lowest point of an indentation in the base package encapsulation 108. For example, the recess bottom 212 can represent the second surface of the support recess 204. For a specific example, a depth 214 of the support recess 204 can be formed with the recess bottom 212 of the support recess 204 coplanar with the interposer top 216. The support recess 204 includes a continuous surface 213 from the encapsulation top 240, with the continuous surface 213 starting and ending at the encapsulation top 240 and forming, the recess bottom 212 at the depth 214.

The depth 214 is defined as the vertical distance from the encapsulation top 240 to the recess bottom 212. Furthermore, the depth 214 is defined as greater than 50% of the vertical length of a support structure 210. For example, the depth 214 can represent the vertical distance from the encapsulation top 240 to the recess bottom 212 of the support recess 204. For another example, the support recess 204 can have the depth 214 for maintaining the stackable package 106 planarity.

A recess adhesive 222 is defined as a material for holding components in place. For example, the recess adhesive 222 can include a resin, glue, paste, cement, putty, or a polyvinyl resin emulsion. For a specific example, the recess adhesive 222 can be applied on the recess bottom 212 and the sloped edges of the support recess 204.

The stackable package 106 can include the stackable integrated circuit 102 mounted over the stackable package carrier 104. The stackable package 106 can include the stackable package carrier 104 having the support structure 210 and a system interconnect 234. The support structure 210 is defined as an interconnect that is electronically isolated for providing stability when mounting a packaged integrated circuit over another packaged integrated circuit. For example, the support structure 210 can include an electronically isolated apparatus, such as a dummy solder ball, a plastic bead, a glass bead, or a solder column.

For a specific example, the support structure 210 can be attached on the bottom side of the stackable package 106 and is placed in the support recess 204 to provide stability for mounting the stackable package 106 over the base package 202. For another example, the support structure 210 can be adhered, by the recess adhesive 222, in the support recess 204. The support recess 204 can be formed in the shape of the support structure 210.

The system interconnect 234 is defined as an electrically conductive connector for electronically connecting the packaged integrated circuit to another packaged integrated circuit. For example, the stackable package 106 having the system interconnect 234 can electronically connect with the base package 202 having the interposer 220 by connecting the system interconnect 234 to the interposer 220.

For a specific example, the stackable package 106 can be mounted over the base package 202 having a vertical gap 236 between the stackable package 106 and the base package 202. The vertical gap 236 is defined as the vertical distance between the bottom side of the stackable package carrier 104 and the encapsulation top 240 of the base package encapsulation 108.

For another example, the stackable package 106 can have the system interconnect 234 with a first spacing 238 between each of the system interconnect 234 different from a second spacing 242 between the support structure 210 and the system interconnect 234. The first spacing 238 is defined as the non-vertical distance between each of the system interconnect 234. The second spacing 242 is defined as the non-vertical distance between the system interconnect 234 and the support structure 210.

It has been discovered that the present invention can provide improved structural stability by providing the support structure 210 adhering in the support recess 204 of the base package encapsulation 108. By inserting the support structure 210 in the support recess 204, the mounting of the stackable package 106 over the base package 202 can improve structural stability.

It has also been discovered that the present invention can enhance the board level reliability performance. The adhering of the support structure 210 to the support recess 204 creates a docking system for enhancing the board level reliability performance and for eliminating underfilling process between the stackable package 106 and the base package 202.

Figure 3:
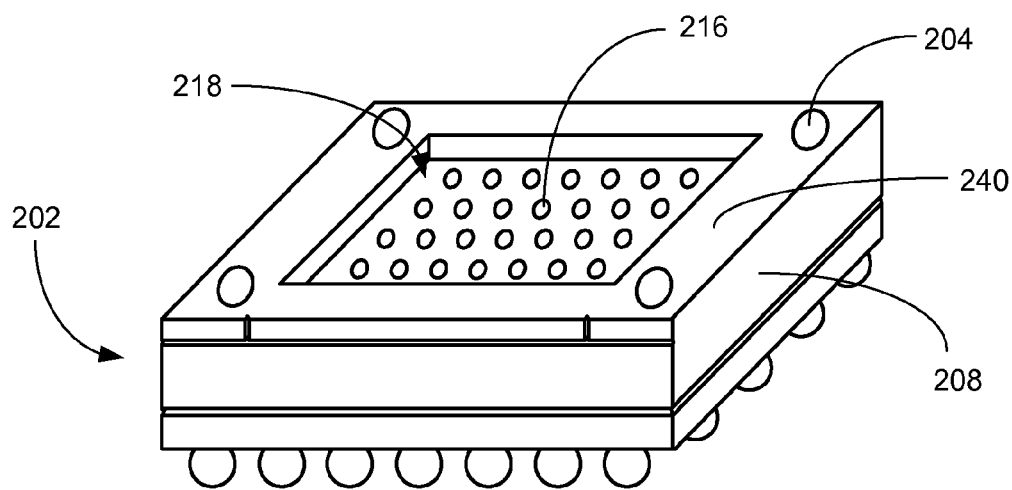
FIG. 3 is an isometric view of the base package.

Referring now to FIG. 3, therein is shown an isometric view of the base package 202. In this example, the base package 202 can have the support recess 204 adjacent to the non-horizontal edge 208. More specifically, the support recess 204 can be formed along the non-horizontal edge 208 with each of the support recess 204 spatially separated. Furthermore, the support recess 204 can be formed between the non-horizontal edge 208 and the cavity 218. In this example, the support recess 204 can be formed on the four corners of the encapsulation top 240 of the base package encapsulation 108. The cavity 218 can expose the interposer top 216.

Figure 4:
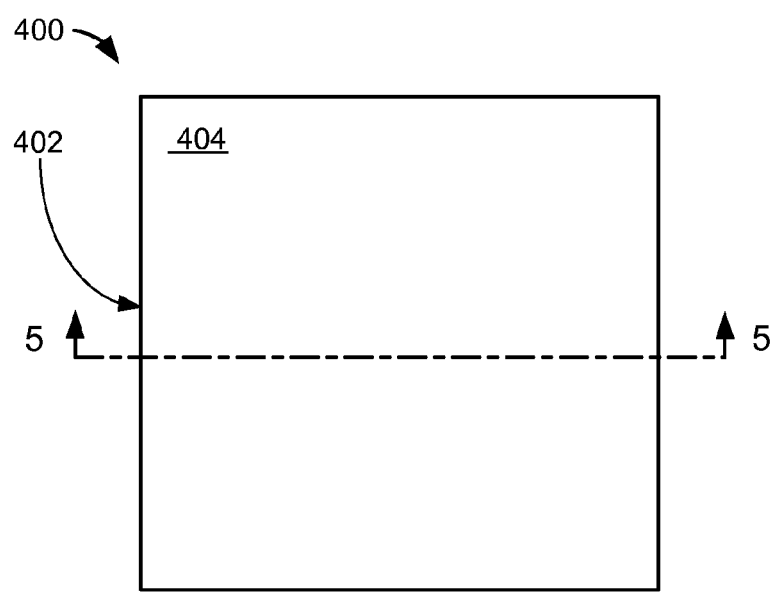
FIG. 4 is a top view of an integrated circuit packaging system in a second embodiment of the present invention.

Referring now to FIG. 4, therein is shown a top view of an integrated circuit packaging system 400 in a second embodiment of the present invention. The top view depicts the top side of a stackable package 402. The stackable package 402 is defined as a packaged integrated circuit that can be mounted on other package or structures, or receive other packages. The stackable package 402 can include a stackable package encapsulation 404. The stackable package encapsulation 404 is defined as a film assist molding, injection molding, or other encasement structure that encapsulates the packaged integrated circuit.

Figure 5:
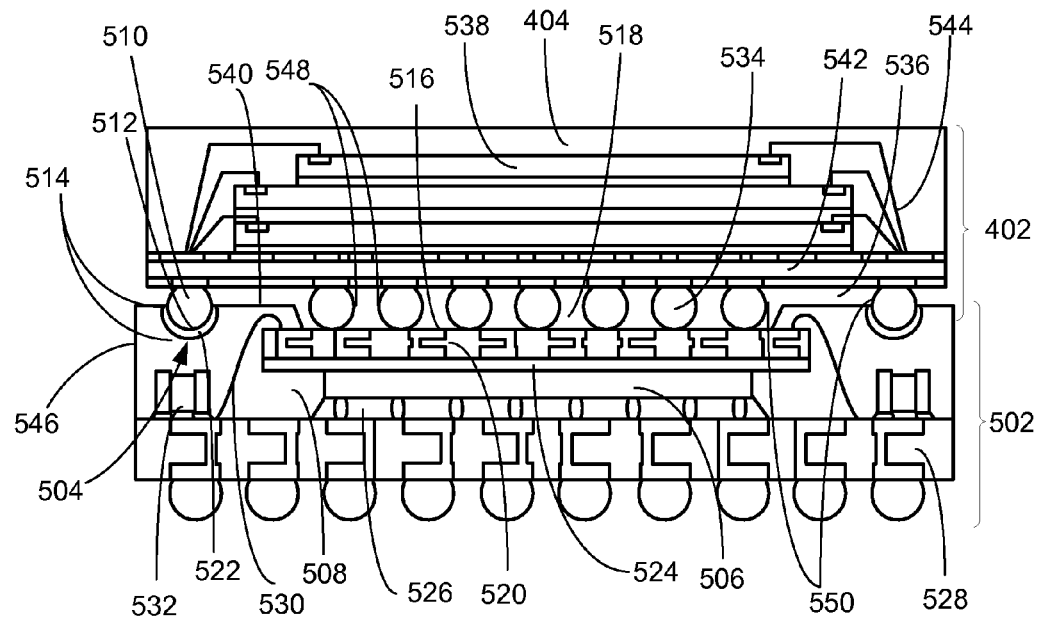
FIG. 5 is a cross-sectional view of the integrated circuit packaging system along line 5-5 of FIG. 4.

Referring now to FIG. 5, therein is shown a cross-sectional view of the integrated circuit packaging system 400 along line 5-5 of FIG. 4. The cross-sectional view depicts the stackable package 402 mounted on top of a base package 502. The base package 502 is defined as a packaged integrated circuit.

The base package 502 can include a base package carrier 528. The base package carrier 528 is defined as a mounting device for an integrated circuit or other electrical components as well as providing electrical connections between, to, and from the devices mounted thereto. For example, a base integrated circuit 506 can be mounted to and over the base package carrier 528. For another example, the base package carrier 528 can represent a substrate.

The base integrated circuit 506 is defined as a chip with active circuitry packaged in the base package 502. For example, the base integrated circuit 506 can include a flip chip, a wire bonded chip, or a packaged integrated circuit.

The base package 502 can include an inner underfill 526. The inner underfill 526 is defined as a structure that provides adhesion and rigidity for mounting an integrated circuit or electrical component on other integrated circuit or electrical component. For example, the inner underfill 526 can be applied to adhere the base integrated circuit 506 to the base package carrier 528. For another example, the inner underfill 526 can include an epoxy mixture that provides rigidity and adhesion.

The base package 502 can include a discrete component 532. The discrete component 532 is defined as an electronic component with one circuit element. For example, the discrete component 532 can be mounted on the base package carrier 528.

The base package 502 can include an inner adhesive 524. The inner adhesive 524 is defined as a sticky material for holding components in place. For example, the inner adhesive 524 can be applied to adhere the base integrated circuit 506 to an interposer 520. For another example, the inner adhesive 524 can include a resin, glue, paste, cement, putty, or a polyvinyl resin emulsion.

The base package 502 can include the interposer 520 having an interposer top 516. The interposer 520 is defined as an electrical interface routing structure. The interposer top 516 is defined as the top side of the interposer 520.

The base package 502 can include a base electrical interconnect 530. The base electrical interconnect 530 is defined as a connection interface for electrical connection to other components. For example, the base electrical interconnect 530 can include a bondwire, solder columns, solder balls, conductive interconnects, or lateral interconnects. The base electrical interconnect 530 can represent a bondwire to electronically connect the base package carrier 528 and the interposer 520. For example, the base electrical interconnect 530 can be made out of a material representing aluminum, copper, gold, or alloy thereof. Furthermore, the base electrical interconnect 530 can include aluminum, copper, or gold wire.

A base package encapsulation 508 can encapsulate the base package 502. For example, the base package encapsulation 508 can be formed over the base package carrier 528 and the interposer 520 with the base package encapsulation 508 having a cavity 518 for exposing the interposer 520. The cavity 518 is defined as an indentation of a surface with sloped edges terminating at the interposer 520.

The interposer 520 can represent the second surface of the cavity 518. For example, the base package encapsulation 508 can be formed with the interposer top 516 of the interposer 520 exposed.

The base package encapsulation 508 can include a support recess 504. The support recess 504 is defined as an indentation from a top surface of the base package encapsulation 508. For example, the support recess 504 can be formed by various known methods, such as from protruded mode chase, mechanical or laser drilling, chemical etching with mask, or a combination thereof For a specific example, the shape of the support recess 504 can include variety of geometrics, such as of a circular geometry, an oval geometry, including linear or arc shaped segments, or a combination thereof. In this example, the support recess 504 can be formed as a dimple with a shape of a half sphere.

For example, the support recess 504 can be formed from an encapsulation top 540 into the base package encapsulation 508 between a non-horizontal edge 546 of the base package encapsulation 508 and the cavity 518. The encapsulation top 540 can represent the surface or the top side of the base package encapsulation 508. The non-horizontal edge 546 is defined as the borderline of the packaged integrated circuit where the packaged integrated circuit had been separated from a larger structure by a process of sawing, shearing, laser trimming, or the like.

For another example, the support recess 504 can be formed in the base package encapsulation 508 between the non-horizontal edge 546 of the base package encapsulation 508 and the cavity 518. For a different example, the support recess 504 can be formed adjacent to the non-horizontal edge 546 of the base package encapsulation 508 with each of the support recess 504 spatially separated. For another example, the support recess 504 can be formed above the discrete component 532. For a different example, the support recess 504 can be formed evenly distributed on the base package encapsulation 508.

The support recess 504 can include a recess bottom 512. The recess bottom 512 is defined as the lowest point of an indentation in the base package encapsulation 508. For example, the recess bottom 512 can represent the second surface of the support recess 504. For a specific example, a depth 514 of the support recess 504 can be formed with the recess bottom 512 of the support recess 504 coplanar with the interposer top 516.

The depth 514 is defined as the vertical distance from the encapsulation top 540 to the recess bottom 512. Furthermore, the depth 214 is defined as greater than 50% of the vertical length of a support structure 510. For example, the depth 514 can represent the vertical distance from the encapsulation top 540 to the recess bottom 512 of the support recess 504. For another example, the support recess 504 can have the depth 514 for maintaining the stackable package 402 planarity.

A recess adhesive 522 is defined as a material for holding components in place. For example, the recess adhesive 522 can include a resin, glue, paste, cement, putty, or a polyvinyl resin emulsion. For a specific example, the recess adhesive 522 can be applied on the recess bottom 512 and the sloped edges of the support recess 504.

The stackable package 402 can include a stackable package carrier 542 having the support structure 510 and a system interconnect 534. The stackable package carrier 542 is defined as a mounting device for an integrated circuit or other electrical components as well as providing electrical connections between, to, and from the devices mounted thereto. The support structure 510 is defined as an interconnect that is electronically isolated for providing stability when mounting a packaged integrated circuit over another packaged integrated circuit. For example, the support structure 510 can include an electronically isolated apparatus, such as a dummy solder ball, a plastic bead, a glass bead, or a solder column.

For a specific example, the support structure 510 can be attached on the bottom side of the stackable package 402 and is placed in the support recess 504 to provide stability for mounting the stackable package 402 over the base package 502. For another example, the support structure 510 can be adhered, by the recess adhesive 522, in the support recess 504. The support recess 504 can be formed in the shape of the support structure 510.

The system interconnect 534 is defined as an electrically conductive connector for electronically connecting the packaged integrated circuit to another packaged integrated circuit. For example, the stackable package 402 having the system interconnect 534 can electronically connect with the base package 502 having the interposer 520 by connecting the system interconnect 534 to the interposer 520.

For a specific example, the stackable package 402 can be mounted over the base package 502 having a vertical gap 536 between the stackable package 402 and the base package 502. The vertical gap 536 is defined as the vertical distance between the bottom side of the stackable package carrier 542 and the encapsulation top 540 of the base package encapsulation 508.

For another example, the stackable package 402 can have the system interconnect 534 with a first spacing 548 between each of the system interconnect 534 different from a second spacing 550 between the support structure 510 and the system interconnect 534. The first spacing 548 is defined as the non-vertical distance between each of the system interconnect 534. The second spacing 550 is defined as the non-vertical distance between the system interconnect 534 and the support structure 510.

The stackable package 402 can include a stackable integrated circuit 538. The stackable integrated circuit 538 is defined as a chip with active circuitry fabricated thereon. For example, the stackable integrated circuit 538 can include a flip chip, a wire bonded chip, or a packaged integrated circuit. For another example, the stackable integrated circuit 538 can be mounted over the stackable package carrier 542.

The stackable package 402 can include a top electrical interconnect 544. The top electrical interconnect 544 is defined as a connection interface for electrical connection to other components. For example, the top electrical interconnect 544 can include a bondwire, solder columns, solder balls, conductive interconnects, or lateral interconnects. The top electrical interconnect 544 can represent a bondwire to electronically connect the stackable package carrier 542 and the stackable integrated circuit 538. For example, the top electrical interconnect 544 can be made out of a material representing aluminum, copper, gold, or alloy thereof. Furthermore, the top electrical interconnect 544 can include aluminum, copper, or gold wire. The stackable package encapsulation 404 can encapsulate the stackable package 402.

It has been discovered that the present invention can provide improved structural stability by providing the support structure 510 adhering in the support recess 504 of the base package encapsulation 508. By inserting the support structure 510 in the support recess 504, the mounting of the stackable package 402 over the base package 502 can improve structural stability.

It has also been discovered that the present invention can enhance the board level reliability performance. The adhering of the support structure 510 to the support recess 504 creates a docking system for enhancing the board level reliability performance and for eliminating underfilling process between the stackable package 402 and the base package 502.

Figure 6:
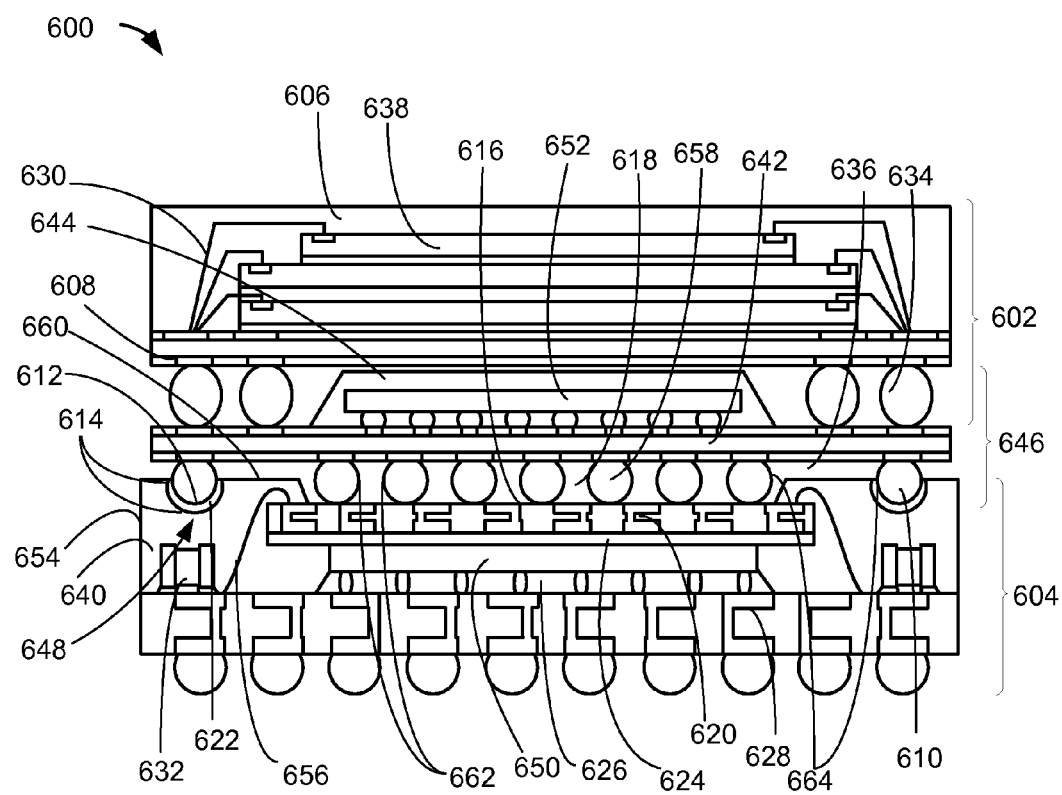
FIG. 6 is a cross-sectional view of an integrated circuit packaging system as exemplified by the top view of FIG. 4 and along line 5-5 of FIG. 4 in a third embodiment of the present invention.

Referring now to FIG. 6, therein is shown a cross-sectional view of an integrated circuit packaging system 600 as exemplified by the top view of FIG. 4 and along line 5-5 of FIG. 4 in a third embodiment of the present invention. The cross sectional view depicts a top stackable package 602 mounted on top of a middle stackable package 646. And the cross sectional view also depicts the middle stackable package 646 mounted on top of a base package 604. The top stackable package 602 is defined as a packaged integrated circuit. The middle stackable package 646 is defined as a packaged integrated circuit. The base package 604 is defined as a packaged integrated circuit.

The base package 604 can include a base package carrier 628. The base package carrier 628 is defined as a mounting device for an integrated circuit or other electrical components as well as providing electrical connections between, to, and from the devices mounted thereto. For example, a base integrated circuit 650 can be mounted to and over the base package carrier 628. For another example, the base package carrier 628 can represent a substrate.

The base integrated circuit 650 is defined as a chip with active circuitry packaged in the base package 604. For example, the base integrated circuit 650 can include a flip chip, a wire bonded chip, or a packaged integrated circuit. For another example, the base integrated circuit 650 can be mounted over the base package carrier 628.

The base package 604 can include an inner underfill 626. The inner underfill 626 is defined as a structure that provides adhesion and rigidity for mounting an integrated circuit or electrical component on other integrated circuit or electrical component. For example, the inner underfill 626 can be applied to adhere the base integrated circuit 650 to the base package carrier 628. For another example, the inner underfill 626 can include an epoxy mixture that provides rigidity and adhesion.

The base package 604 can include a discrete component 632. The discrete component 632 is defined as an electronic component with one circuit element. For example, the discrete component 632 can be mounted on the base package carrier 628.

The base package 604 can include an inner adhesive 624. The inner adhesive 624 is defined as a sticky material for holding components in place. For example, the inner adhesive 624 can be applied to adhere the base integrated circuit 650 to an interposer 620. For another example, the inner adhesive 624 can include a resin, glue, paste, cement, putty, or a polyvinyl resin emulsion.

The base package 604 can include the interposer 620 having an interposer top 616. The interposer 620 is defined as an electrical interface routing structure. The interposer top 616 is defined as the top side of the interposer 620.

The base package 604 can include a base electrical interconnect 656. The base electrical interconnect 656 is defined as a connection interface for electrical connection to other components. For example, the base electrical interconnect 656 can include a bondwire, solder columns, solder balls, conductive interconnects, or lateral interconnects. The base electrical interconnect 656 can represent a bondwire to electronically connect the base package carrier 628 and the interposer 620. For example, the base electrical interconnect 656 can be made out of a material representing aluminum, copper, gold, or alloy thereof. Furthermore, the base electrical interconnect 656 can include aluminum, copper, or gold wire.

A base package encapsulation 640 can encapsulate the base package 604. For example, the base package encapsulation 640 can be formed over the base package carrier 628 and the interposer 620 with the base package encapsulation 640 having a cavity 618 for exposing the interposer 620. The cavity 618 is defined as an indentation of a surface with sloped edges terminating at the interposer 620.

The interposer 620 can represent the second surface of the cavity 618. For example, the base package encapsulation 640 can be formed with the interposer top 616 of the interposer 620 exposed.

The base package encapsulation 640 can include a support recess 648. The support recess 648 is defined as an indentation from a top surface of the base package encapsulation. For example, the support recess 648 can be formed by various known methods, such as from protruded mode chase, mechanical or laser drilling, chemical etching with mask, or a combination thereof.

For a specific example, the shape of the support recess 648 can include variety of geometrics, such as of a circular geometry, an oval geometry, including linear or arc shaped segments, or a combination thereof. In this example, the support recess 648 can be formed as a dimple with a shape of a half sphere.

For example, the support recess 648 can be formed from an encapsulation top 660 into the base package encapsulation 640 between a non-horizontal edge 654 of the base package encapsulation 640 and the cavity 618. The encapsulation top 660 can represent the surface or the top side of the base package encapsulation 640. The non-horizontal edge 654 is defined as the borderline of the packaged integrated circuit where the packaged integrated circuit had been separated from a larger structure by a process of sawing, shearing, laser trimming, or the like.

For another example, the support recess 648 can be formed in the base package encapsulation 640 between the non-horizontal edge 654 of the base package encapsulation 640 and the cavity 618. For a different example, the support recess 648 can be formed adjacent to the non-horizontal edge 654 of the base package encapsulation 640 with each of the support recess 648 spatially separated. For another example, the support recess 648 can be formed above the discrete component 632. For a different example, the support recess 648 can be formed evenly distributed on the base package encapsulation 640.

The support recess 648 can include a recess bottom 612. The recess bottom 612 is defined as the lowest point of an indentation in the base package encapsulation 640. For example, the recess bottom 612 can represent the second surface of the support recess 648. For a specific example, a depth 614 of the support recess 648 can be formed with the recess bottom 612 of the support recess 648 coplanar with the interposer top 616.

The depth 614 is defined as the vertical distance from the encapsulation top 660 to the recess bottom 612. Furthermore, the depth 614 is defined as greater than 50% of the vertical length of a support structure 610. For example, the depth 614 can represent the vertical distance from the encapsulation top 660 to the recess bottom 612 of the support recess 648. For another example, the support recess 648 can have the depth 614 for maintaining a middle stackable package 646 planarity.

A recess adhesive 622 is defined as a material for holding components in place. For example, the recess adhesive 622 can include a resin, glue, paste, cement, putty, or a polyvinyl resin emulsion. For a specific example, the recess adhesive 622 can be applied on the recess bottom 612 and the sloped edges of the support recess 648.

The middle stackable package 646 can include the middle package carrier 642. The middle package carrier 642 is defined as a mounting device for an integrated circuit or other electrical components as well as providing electrical connections between, to, and from the devices mounted thereto. For example, the middle package carrier 642 can represent a substrate.

The middle package carrier 642 can have the support structure 610 and a middle system interconnect 658. The support structure 610 is defined as an interconnect that is electronically isolated for providing stability when mounting a packaged integrated circuit over another packaged integrated circuit. For example, the support structure 610 can include an electronically isolated apparatus, such as a dummy solder ball, a plastic bead, a glass bead, or a solder column.

For a specific example, the support structure 610 can be attached on the bottom side of the middle stackable package 646 and is placed in the support recess 648 to provide stability for mounting the middle stackable package 646 over the base package 604. For another example, the support structure 610 can be adhered, by the recess adhesive 622, in the support recess 648. The support recess 648 can be formed in the shape of the support structure 610.

For another example, the middle stackable package 646 can have the middle system interconnect 658 with a first spacing 662 between each of the middle system interconnect 658 different from a second spacing 664 between the support structure 610 and the middle system interconnect 658. The first spacing 662 is defined as the non-vertical distance between each of the middle system interconnect 658. The second spacing 664 is defined as the non-vertical distance between the middle system interconnect 658 and the support structure 610.

The middle system interconnect 658 is defined as an electrically conductive connector for electronically connecting the packaged integrated circuit to another packaged integrated circuit. For example, the middle stackable package 646 having the middle system interconnect 658 can electronically connect with the base package 604 having the interposer 620 by connecting the middle system interconnect 658 to the interposer 620.

For a specific example, the middle stackable package 646 can be mounted over the base package 604 having a vertical gap 636 between the middle stackable package 646 and the base package 604. The vertical gap 636 is defined as the vertical distance between the bottom side of the middle package carrier 642 and the encapsulation top 660 of the base package encapsulation 640.

The middle stackable package 646 can include a middle integrated circuit 652. The middle integrated circuit 652 is defined as a chip with active circuitry packaged in the middle stackable package 646. For example, the middle integrated circuit 652 can include a flip chip, a wire bonded chip, or a packaged integrated circuit. For another example, the middle integrated circuit 652 can be mounted over the middle package carrier 642.

A middle package encapsulation 644 can encapsulate the middle integrated circuit 652. The middle package encapsulation 644 is defined as a film assist molding, injection molding, or other encasement structure that encapsulates the packaged integrated circuit.

The top stackable package 602 can include a top package carrier 608. The top package carrier 608 is defined as a mounting device for an integrated circuit or other electrical components as well as providing electrical connections between, to, and from the devices mounted thereto. For example, the top package carrier 608 can represent a substrate.

The top package carrier 608 can include a top system interconnect 634. The top system interconnect 634 is defined as an electrically conductive component for electronically connecting the packaged integrated circuit to another packaged integrated circuit. For example, the top stackable package 602 having the top system interconnect 634 can electronically connect with the middle stackable package 646 by connecting the middle system interconnect 658 to the middle package carrier 642.

The top stackable package 602 can include a top integrated circuit 638. The top integrated circuit 638 is defined as a chip with active circuitry packaged in the top stackable package 602. For example, the top integrated circuit 638 can include a flip chip, a wire bonded chip, or a packaged integrated circuit. For another example, the top integrated circuit 638 can be mounted over the top package carrier 608.

The top stackable package 602 can include a top electrical interconnect 630. The top electrical interconnect 630 is defined as a connection interface for electrical connection to other components. For example, the top electrical interconnect 630 can include a bondwire, solder columns, solder balls, conductive interconnects, or lateral interconnects. The top electrical interconnect 630 can represent a bondwire to electronically connect the top package carrier 608 and the top integrated circuit 638. For example, the top electrical interconnect 630 can be made out of a material representing aluminum, copper, gold, or alloy thereof. Furthermore, the top electrical interconnect 630 can include aluminum, copper, or gold wire.

A top package encapsulation 606 can encapsulate the top stackable package 602. The top package encapsulation 606 is defined as a film assist molding, injection molding, or other encasement structure that encapsulates the packaged integrated circuit.

It has been discovered that the present invention can provide improved structural stability by providing the support structure 610 adhering in the support recess 648 of the base package encapsulation 640. By inserting the support structure 610 in the support recess 648, the mounting of the middle stackable package 646 over the base package 604 can improve structural stability.

It has also been discovered that the present invention can enhance the board level reliability performance. The adhering of the support structure 610 to the support recess 648 creates a docking system for enhancing the board level reliability performance and for eliminating underfilling process between the middle stackable package 646 and the base package 604.

Figure 7:
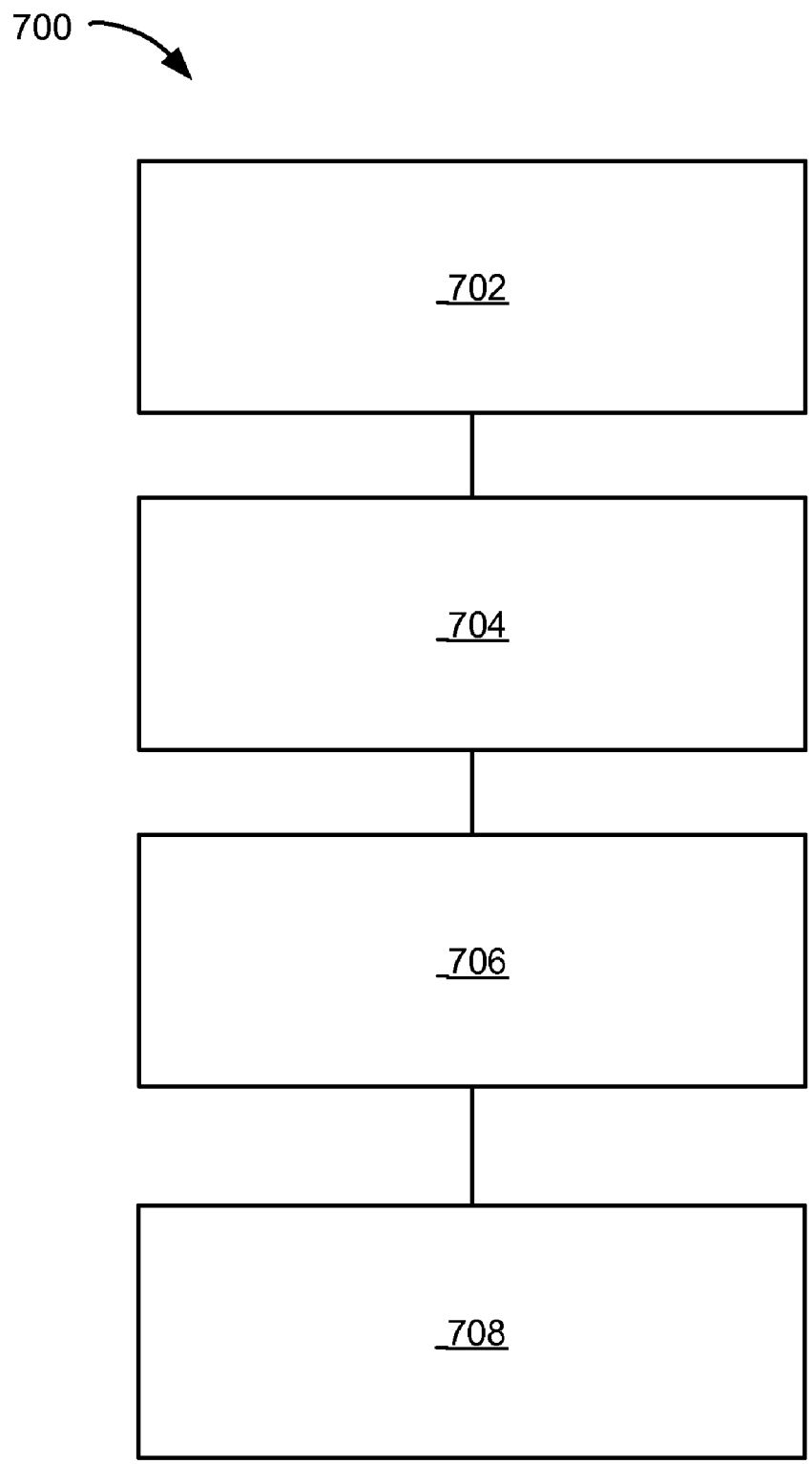
FIG. 7 is a flow chart of a method of manufacture of an integrated circuit packaging system in a further embodiment of the present invention.

Referring now to FIG. 7, therein is shown a flow chart of a method 700 of manufacture of an integrated circuit packaging system 100 in a further embodiment of the present invention. The method 700 includes: providing a base package carrier in a block 702; mounting an interposer over the base package carrier in a block 704; forming a base package encapsulation over the base package carrier and the interposer with the base package encapsulation having a cavity for exposing the interposer in a block 706; and forming a support recess in the base package encapsulation between a non-horizontal edge of the base package encapsulation and the cavity in a block 708.

Thus, it has been discovered that the mountable integrated circuit packaging system of the present invention furnishes important and heretofore unknown and unavailable solutions, capabilities, and functional aspects for improving yield, increasing reliability, and reducing cost of circuit system.

The resulting processes and configurations are straightforward, cost-effective, uncomplicated, highly versatile, and effective, can be surprisingly and non-obviously implemented by adapting known technologies, and are thus readily suited for efficiently and economically manufacturing integrated circuit packaging system that are fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A method of a manufacture of an integrated circuit packaging system comprising:
   providing a base package carrier;
   mounting an interposer over the base package carrier;
   forming a base package encapsulation over the base package carrier and the interposer with the base package encapsulation having an encapsulation top and a cavity for exposing the interposer; and
   forming a support recess in the base package encapsulation between a non-horizontal edge of the base package encapsulation and the cavity with the support recess providing a continuous surface starting and ending at the encapsulation top.

2. The method as claimed in claim 1 further comprising providing system interconnects with a first spacing between each of the system interconnects different from a second spacing between a support structure and the system interconnects.

3. The method as claimed in claim 1 further comprising mounting a stackable package having a support structure in the support recess over the base package encapsulation.

4. The method as claimed in claim 1 wherein:
   forming the base package encapsulation includes exposing the interposer; and
   forming the support recess includes forming a recess bottom coplanar with the interposer top.

5. The method as claimed in claim 1 wherein forming the support recess includes forming the support recess having a depth for maintaining a stackable package planarity.

6. A method of a manufacture of an integrated circuit packaging system comprising:
   providing a base package carrier;
   mounting an interposer over the base package carrier;
   forming a base package encapsulation over the base package carrier and the interposer with the base package encapsulation having an encapsulation top and a cavity for exposing the interposer;
   forming a support recess in the base package encapsulation between a non-horizontal edge of the base package encapsulation and the cavity with the support recess providing a continuous surface starting and ending at the encapsulation top; and
   mounting a stackable package having a support structure over the base package encapsulation.

7. The method as claimed in claim 6 wherein forming the support recess includes forming the support recesses evenly distributed on the base package encapsulation.

8. The method as claimed in claim 6 further comprising:
   applying a recess adhesive in the support recess; and
   wherein:
   mounting the stackable package includes adhering the support structure, by the recess adhesive, in the support recess.

9. The method as claimed in claim 6 further comprising:
   mounting a discrete component on the base package carrier; and
   wherein:
   forming the support recess includes forming the support recess above the discrete component.

10. The method as claimed in claim 6 wherein mounting the stackable package includes mounting the stackable package having a vertical gap between the stackable package and the base package.

11. An integrated circuit packaging system comprising:
    a base package carrier;
    an interposer over the base package carrier; and
    a base package encapsulation over the base package carrier and the interposer with the base package encapsulation including:
       an encapsulation top,
       a cavity for exposing the interposer, and
       a support recess formed between a non-horizontal edge of the base package encapsulation and the cavity, with the support recess providing a continuous surface starting and ending and at the encapsulation top.

12. The system as claimed in claim 11 further comprising system interconnects with a first spacing between each of the system interconnects different from a second spacing between a support structure and the system interconnects.

13. The system as claimed in claim 11 further comprising a stackable package having a support structure in the support recess over the base package encapsulation.

14. The system as claimed in claim 11 wherein:
the base package encapsulation includes the interposer exposed; and
the support recess includes a recess bottom coplanar with the interposer top.

15. The system as claimed in claim 11 wherein the support recess includes the support recess having a depth a depth for maintaining stackable package planarity.

16. The system as claimed in claim 11 further comprising a stackable package having a support structure mounted over the base package encapsulation.

17. The system as claimed in claim 16 wherein the support recess includes the support recesses evenly distributed on the base package encapsulation.

18. The system as claimed in claim 16 further comprising: wherein:
the stackable package includes the support structure adhered, by the recess adhesive, in the support recess.

19. The system as claimed in claim 16 further comprising:
a discrete component mounted on the base package carrier; and
wherein:
the support recess includes the support recess formed above the discrete component.

20. The system as claimed in claim 16 wherein the stackable package includes the stackable package mounted having a vertical gap between the stackable package and the base package.

* * * * *

UNITED STATES PATENT AND TRADEMARK OFFICE
CERTIFICATE OF CORRECTION

| | | Page 1 of 1 |
|---|---|---|
| PATENT NO. | : 8,389,329 B2 | |
| APPLICATION NO. | : 13/118955 | |
| DATED | : March 5, 2013 | |
| INVENTOR(S) | : Cho et al. | |

It is certified that error appears in the above-identified patent and that said Letters Patent is hereby corrected as shown below:

In the Claims:

Column 14, claim 11, line 60, delete "ending and at" and insert therefore --ending at--.

Column 16, claim 18, insert between lines 1 and 2
    --a recess adhesive applied in the support recess; and--.

Signed and Sealed this
Twenty-seventh Day of October, 2015

Michelle K. Lee
*Director of the United States Patent and Trademark Office*